(12) United States Patent
Kennedy, III et al.

(10) Patent No.: US 6,285,542 B1
(45) Date of Patent: Sep. 4, 2001

(54) ULTRA-SMALL RESISTOR-CAPACITOR THIN FILM NETWORK FOR INVERTED MOUNTING TO A SURFACE

(75) Inventors: Robert M. Kennedy, III; Gheorghe Korony; Donghang Liu, all of Myrtle Beach; Jeffrey P. Mevissen, Conway; Robert H. Heistand, II, Pawleys Island, all of SC (US)

(73) Assignee: AVX Corporation, Myrtle Beach, SC (US)

( * ) Notice: Subject to any disclaimer, the term of this patent is extended or adjusted under 35 U.S.C. 154(b) by 0 days.

(21) Appl. No.: 09/293,817

(22) Filed: Apr. 16, 1999

(51) Int. Cl.[7] .............................. H01G 4/38; H01G 4/30; H01G 4/005; H01G 7/00
(52) U.S. Cl. .................. 361/328; 361/301.4; 361/303; 361/312; 29/25.42
(58) Field of Search ..................................... 361/328, 311, 361/306.1, 301.4, 301.1, 301.2, 301.3, 303, 305, 306.3, 307, 308.1, 309, 312; 27/25.42

(56) References Cited

U.S. PATENT DOCUMENTS

| | | |
|---|---|---|
| 3,268,744 | 8/1966 | Kaiser et al. . |
| 3,273,033 | 9/1966 | Rossmeisl . |
| 3,778,689 | 12/1973 | Bodway . |
| 4,251,326 | 2/1981 | Arcidiacono et al. . |
| 4,410,867 | 10/1983 | Arcidiacono et al. . |
| 4,788,524 | 11/1988 | Ozaki . |
| 4,801,469 | 1/1989 | Norwood . |
| 4,933,208 | 6/1990 | Dorinski . |
| 4,971,924 | 11/1990 | Tigelaar et al. . |
| 5,065,220 | 11/1991 | Paterson et al. . |
| 5,079,670 | 1/1992 | Tigelaar et al. . |
| 5,093,774 | 3/1992 | Cobb . |
| 5,108,941 | 4/1992 | Paterson et al. . |
| 5,206,788 | 4/1993 | Larson et al. . |
| 5,288,660 | 2/1994 | Hua et al. . |
| 5,370,766 | 12/1994 | Desaigoudar et al. . |
| 5,420,745 | 5/1995 | Hidaka et al. . |
| 5,450,263 | 9/1995 | Desaigoudar et al. . |
| 5,457,598 | 10/1995 | Radford et al. . |
| 5,466,887 | 11/1995 | Hasegawa . |
| 5,600,532 | 2/1997 | Michiya et al. . |
| 5,625,529 | 4/1997 | Lee et al. . |
| 5,731,747 | 3/1998 | Van De Walle et al. . |
| 5,822,175 | * 10/1998 | Azuma ............................ 361/321.5 |
| 5,880,925 | 3/1999 | DuPre et al. . |
| 5,889,445 | * 3/1999 | Ritter et al. ........................ 333/172 |

OTHER PUBLICATIONS

Liu, 09/034,754, Mar. 4, 1998.

* cited by examiner

Primary Examiner—Dean A. Reichard
Assistant Examiner—Eric Thomas
(74) Attorney, Agent, or Firm—Dority & Manning, P.A.

(57) ABSTRACT

A very small electronic device adapted for inverted mounting to a circuit board includes a multiplicity of capacitors and resistors built on a substrate. The capacitors and resistors are interconnected so as to provide multiple RC circuits in various circuit arrangements. The multiple layers of the device are covered by an encapsulate having openings to expose terminal pads of the RC circuits. The openings are filled with solder to produce the individual terminations of the device in a ball grid array (BGA). The device saves cost and/or board space in the manufacture of larger electronic equipment through the elimination of multiple discrete components. In addition, very low inductance is achieved due to the close proximity of the device to a circuit board on which it is mounted.

23 Claims, 10 Drawing Sheets

ULTRA-SMALL RESISTOR-CAPACITOR THIN FILM NETWORK FOR INVERTED MOUNTING TO A SURFACE

BACKGROUND OF THE INVENTION

The present invention relates generally to small electronic components adapted to be mounted on a larger circuit board. More particularly, the invention relates to an ultra-small device having multiple circuits of passive components for use in a variety of applications.

For some time, the design of various electronic components has been driven by a general industry trend toward miniaturization. In this regard, a need exists for ever smaller electronic components having selected operating characteristics. For example, it may be desirable in certain applications to provide a very small device having an array of individual filter circuits. Such a device may be used in various applications for providing AC terminations and low pass filtering, as well as EMI and RFI filtering. In addition, ever-increasing clock frequencies in electronic equipment require electronic components having smaller levels of inherent series inductance (ISL).

SUMMARY OF THE INVENTION

The present invention recognizes various disadvantages of prior art constructions and methods. Accordingly, it is an object of the present invention to provide a novel electronic component.

It is a further object of the present invention to provide a novel array of multiple circuits in a singular package of small size.

It is a further object of the present invention to provide a novel array of multiple circuits in a singular package that exhibits a low inherent series inductance.

It is a further object of the present invention to provide a novel array wherein capacitors of the individual circuits therein may each have a relatively large capacitance value.

It is a still further object of the present invention to provide a novel RC array device of the thin film type.

It is an additional object of the present invention to provide a method of manufacturing a thin film circuit array.

Some of these objects are achieved by a miniature array device for inverted mounting to a surface. The device comprises a substrate having predetermined width and length dimensions. A plurality of thin film RC circuits are located on the substrate, each including at least one terminal pad for connection to external circuitry. An encapsulate is disposed over the RC circuits and defines openings therein to expose the terminal pads. Solder material is located in the openings defined in the encapsulate.

Often, the encapsulate may comprise an inner compliant layer and an outer encapsulate layer. In such embodiments, the opening will be defined in the outer encapsulate layer. The compliant layer will serve to absorb stress between the array device and the underlying circuit board.

In exemplary embodiments, at least four RC circuits may be provided on the substrate. Each of the RC circuits may comprise at least one resistor having a value in a range of approximately 5 ohms to 500 kilo-ohms. At least one capacitor having a value of 4 picofarads to approximately 100,000 picofarads may also be provided in each of the RC circuits. Frequently, the resistor and capacitor provided in at least some of the RC circuits may be connected to provide a respective series RC circuit. It should be appreciated that other types of connections as would be apparent to those skilled in the art, such as parallel or distributed connections, may also be utilized in accordance with the present invention.

Often, a dielectric material of relatively high dielectric constant will be used in the capacitors of the RC circuits. For example, the dielectric material may have a dielectric constant of at least 100. In some cases, the dielectric constant may be as high as 10,000. Often, it will be desirable to utilize a lead-based dielectric material, such as a PZT dielectric material. Due to the high dielectric constant, the dielectric layer may have a thickness as low as about 0.1 to 2 $\mu$m.

Each of the RC circuits will preferably comprise a plurality of layers patterned to form predetermined circuit elements. Where the layers are conductive, the conductive layers may consist of more than one material in alloy, sublayer or lattice structure. In some embodiments, the plurality of layers may include a first conductive pattern defining at least one first capacitor plate. A dielectric layer is juxtaposed to the first capacitor plate. A second conductive pattern defines at least one second capacitor plate situated in relation to the first capacitor plate so as to form a capacitor. A thin film resistor is also provided, electrically connected to the second capacitor plate.

Often, the thin film resistor may be formed from a patterned combination having a conductive layer contiguous to a resistor layer. A portion of the conductive layer is removed from the resistor layer to provide a predetermined resistor value. In such embodiments, a terminal conductive layer defining the terminal pads may also be provided.

In other exemplary embodiments, the plurality of layers may include a first conductive pattern defining at least one first capacitor plate. A dielectric layer is juxtaposed to the first capacitor plate. A patterned combination including a conductive layer and contiguous resistor layer is also provided, part of which defines a second capacitor plate. The second capacitor plate is situated with respect to the first capacitor plate so as to form a capacitor. In addition, the conductive layer is removed in a portion of the patterned combination so as to provide a predetermined resistor value. The patterned combination may further define one of the terminal pads.

Other objects of the present invention are achieved by a miniature array device for inverted mounting to a surface. The device comprises a substrate having predetermined width and length dimensions. A plurality of thin film RC circuits are located on the substrate. Each of the RC circuits includes a first conductive pattern defining at least one first capacitor plate. A dielectric layer is disposed on the first capacitor plate. A second conductive pattern defining at least one second capacitor plate is situated in relation to the first capacitor plate so as to form a capacitor. A thin film resistor is electrically connected to the second capacitor plate.

In some exemplary embodiments, the thin film resistor is formed from a patterned combination including a conductive layer contiguous to a resistor layer. A portion of the conductive layer is removed from the resistor layer to provide a predetermined resistor value. Often, a terminal conductive layer will also be provided to define the terminal pads. An encapsulate may be disposed over the RC circuits and defined to expose the respective terminal pads.

Still further objects of the present invention are achieved by a miniature array device for inverted mounting to a surface. The device comprises a substrate having predetermined width and length dimensions. A plurality of thin film RC circuits are located on the substrate. Each of the RC circuits includes a first conductive pattern defining at least one first capacitor plate. A dielectric layer is juxtaposed to the first capacitor plate. A patterned combination is also provided, comprising a conductive layer contiguous to a resistor layer. Part of the patterned combination is situated in relation to the first capacitor plate so as to form a capacitor. The conductive layer is removed from the resistor layer in a portion of the patterned combination so as to provide a predetermined resistor value.

In some exemplary embodiments, the patterned combination further defines terminal pads of the RC circuits. An encapsulate may be disposed over the RC circuits and defined to expose the terminal pads.

If a substrate of oxidized silicon is used, a via may be formed to connect one of the conductive metal layers to the conductive silicon beneath the oxidation layer. The connection is made simultaneously with the deposition and patterning of the metal layer. In this way, an electrical ground may be established to enhance the electrical performance of the circuit.

Additional objects of the present invention are achieved by a method of manufacturing a thin film array device. One step of the method involves providing a generally planar substrate having predetermined length and width dimensions. A first conductive layer is applied to the substrate and formed so as to define a plurality of first capacitor plates. A dielectric layer is next applied to cover the first capacitor plates of the first conductive layer. A second conductive layer is then applied to define a plurality of second capacitor plates opposed to respective first capacitor plates so that respective capacitor devices will be produced. A plurality of thin film resistors are then formed, at least one resistor being associated with each of the capacitor devices and being electrically connected thereto.

According to exemplary methodology, an encapsulate may also be applied over the various layers on the substrate. In addition, the thin film resistors may be formed by removing selected portions of a conductive layer contiguous to a resistor layer.

Other objects, features and aspects of the present invention are provided by various combinations and subcombinations of the disclosed elements, as well as methods of practicing same, which are discussed in greater detail below.

BRIEF DESCRIPTION OF THE DRAWINGS

A full and enabling disclosure of the present invention, including the best mode thereof, to one of ordinary skill in the art, is set forth more particularly in the remainder of the specification, including reference to the accompanying drawings, in which.

Repeat use of reference characters in the present specification and drawings is intended to represent same or analogous features or elements of the invention.

DETAILED DESCRIPTION OF PREFERRED EMBODIMENTS

It is to be understood by one skilled in the art that the present discussion is a description of exemplary embodiments only, and is not intended as limiting the broader aspects of the present invention, which broader aspects are embodied in the exemplary constructions.

Figure 1:
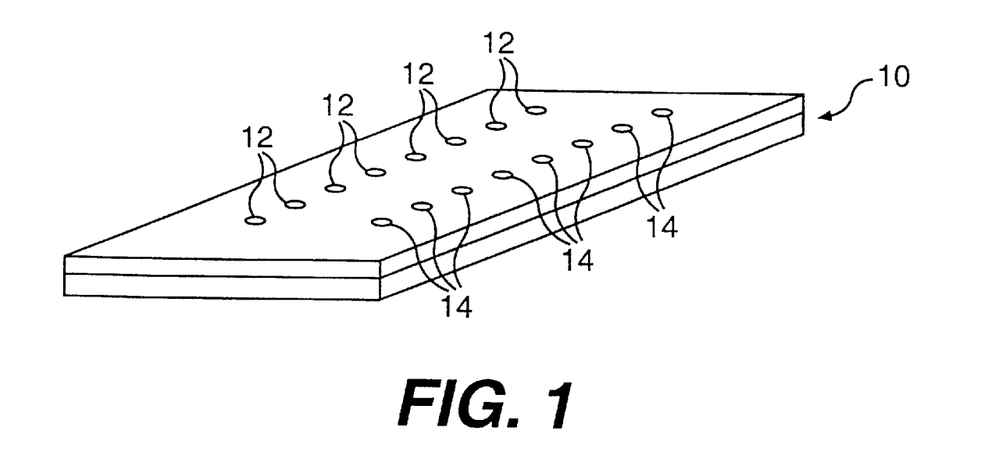
FIG. 1 is a perspective view of an ultra-small array device constructed in accordance with the present invention.

FIG. 1 illustrates an array device 10 constructed in accordance with the present invention. As will be explained more fully below, device 10 includes multiple filter circuits that may be used independently of one another in a larger electronic device. Each of the individual filter circuits preferably includes solder terminations of opposite polarity, such as terminations 12 and 14. The solder terminations may be formed as solder balls in a known ball grid array (BGA) arrangement, or solder may be applied to terminal pads of the individual circuits by a number of known techniques such as evaporation or electroplating.

Figure 2:
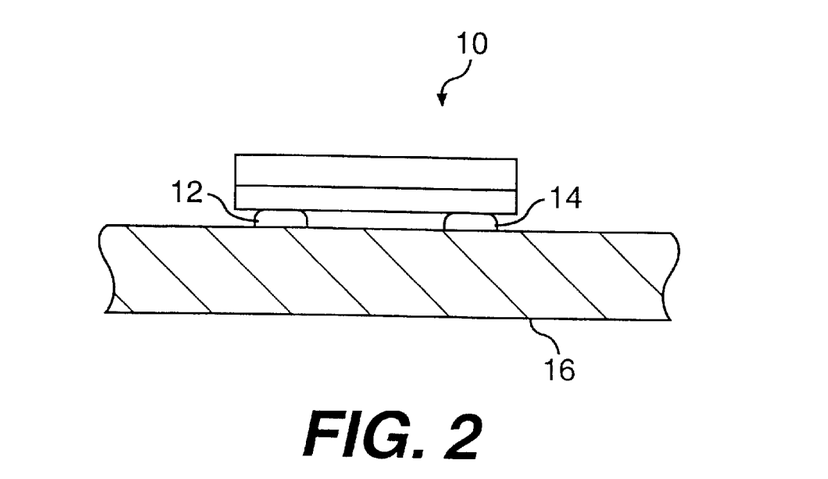
FIG. 2 is a side elevation of the array device of FIG. 1 as mounted to a printed circuit board.

In FIG. 2, device 10 is mounted to a printed circuit board 16. As can be seen, device 10 is inverted so that terminations 12 and 14 on its "top" are electrically connected to circuit traces of the circuit board 16. In addition to providing electrical connection to external circuitry, the solder bumps function to maintain device 10 in its physical location on the board.

The provision of multiple circuits as part of a small singular package may achieve various advantages in both size and/or system cost. For example, system cost may be reduced since the need to pick and place multiple discrete components in the manufacturing process will be eliminated. The small size also preserves board "real estate," which will often be a more important consideration than small cost improvements. The small size and direct proximity of the array device to the circuit board also results in very low ISL, typically less than 1 nH.

Figure 3:
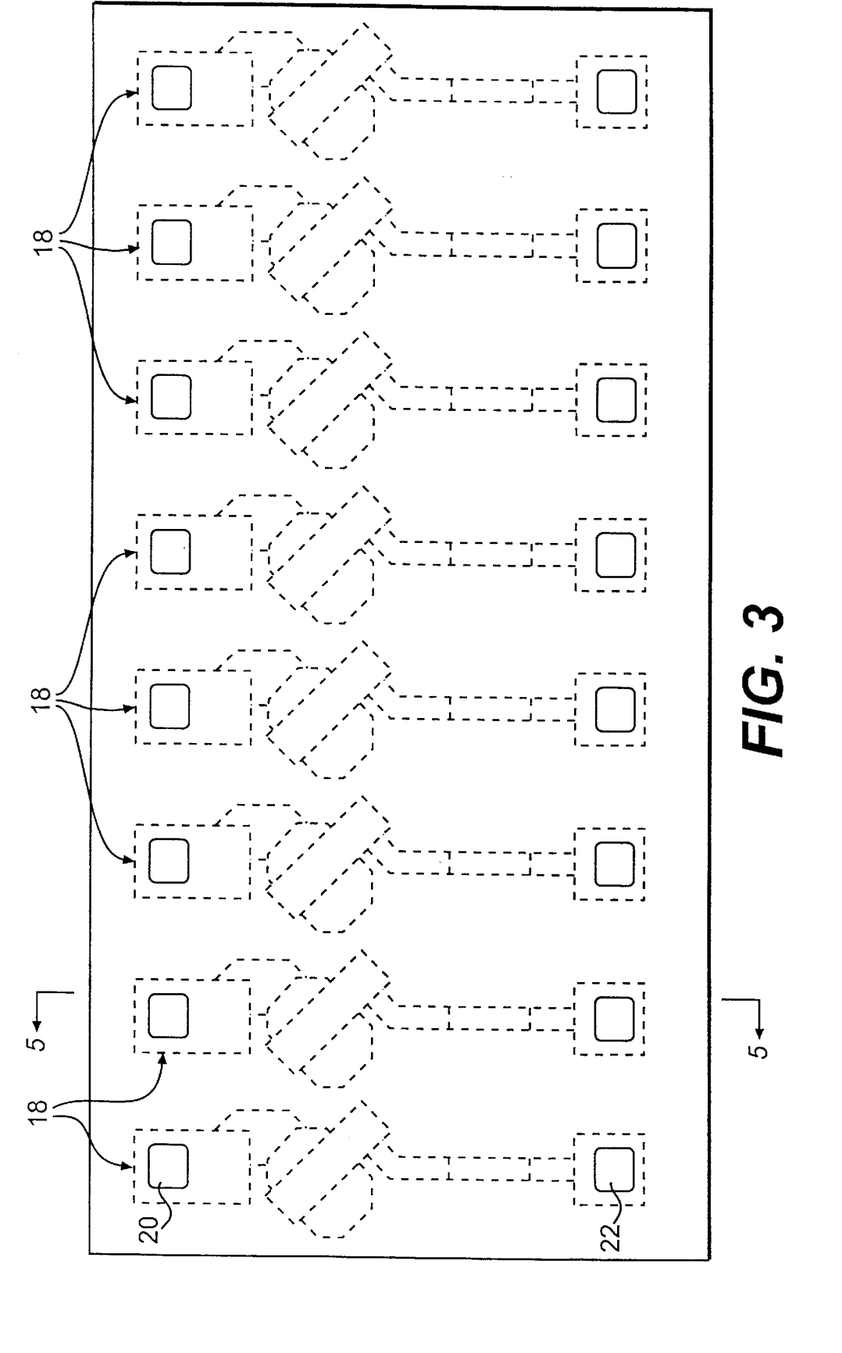
FIG. 3 is a plan view of the array device of FIG. 1.

Referring now to FIG. 3, device 10 is configured in the illustrated embodiment as an integrated array having a total of eight individual RC circuits 18. As can be seen, each of the individual circuits extends between a pair of terminal pads 20 and 22. The region above the terminal pads is filled with solder to yield solder terminations 12 and 14 discussed above.

Figure 4:
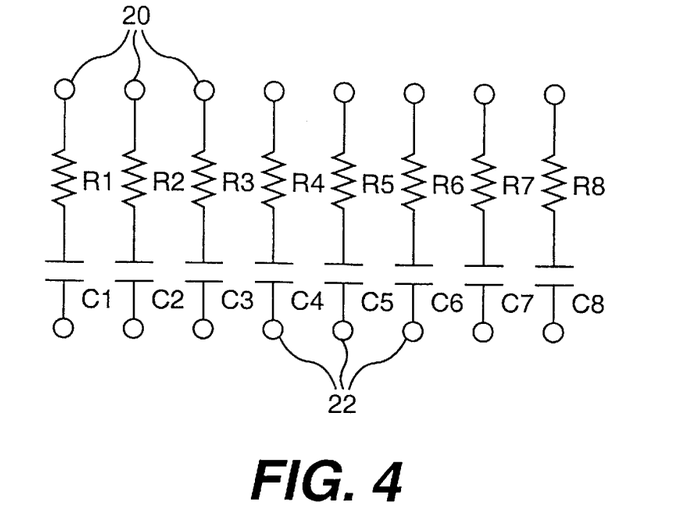
FIG. 4 is a schematic diagram of the circuit provided by the array device of FIG. 1.

Referring now to FIG. 4, RC circuits 18 are arranged in this case as series RC circuits. In other words, each of the circuits includes a respective resistor (R1–R8) connected in series with a respective capacitor (C1–C8). The individual circuits are electrically separate so that one circuit can be connected along a line in the external circuitry completely different from that of any of the other circuits.

It should be appreciated, however, that various other circuit configurations may also be achieved according to the teachings of the present invention. For example, where a plurality of series RC circuits are provided, the individual circuits may be connected together on one side to form a common ground. In this case, the circuits would each have a respective termination at their input, but would share a single termination at their output.

Figure 4A:
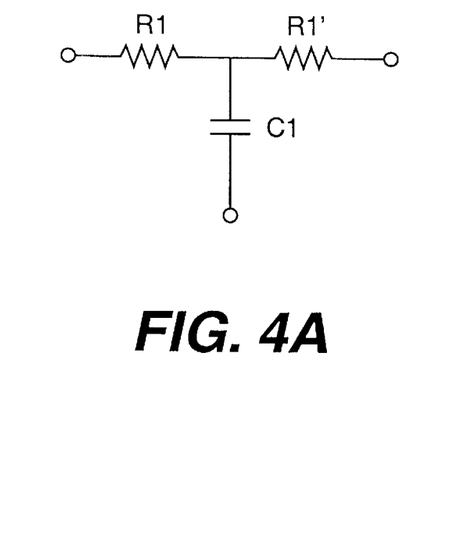
FIGS. 4A and 4B are schematic diagrams of a T-filter circuit and a differential filter circuit which may also be arrayed according to the teachings of the present invention.
Figure 4B:
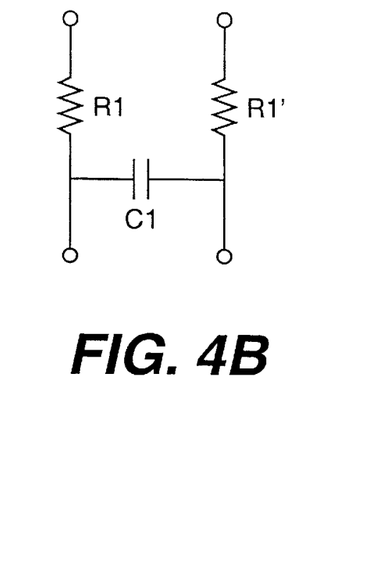

FIGS. 4A and 4B illustrate still further types of circuits that may be implemented in an array device of the present invention. Specifically, FIG. 4A illustrates a 3-terminal "T-filter" having a pair of resistors R1 and R1', along with a capacitor C1. Likewise, FIG. 4B illustrates a 4-terminal differential filter arrangement. It should be distinctly understood that all of the RC circuits on the device need not be identical, but can be customized for the exigencies of a particular application.

Figure 5:
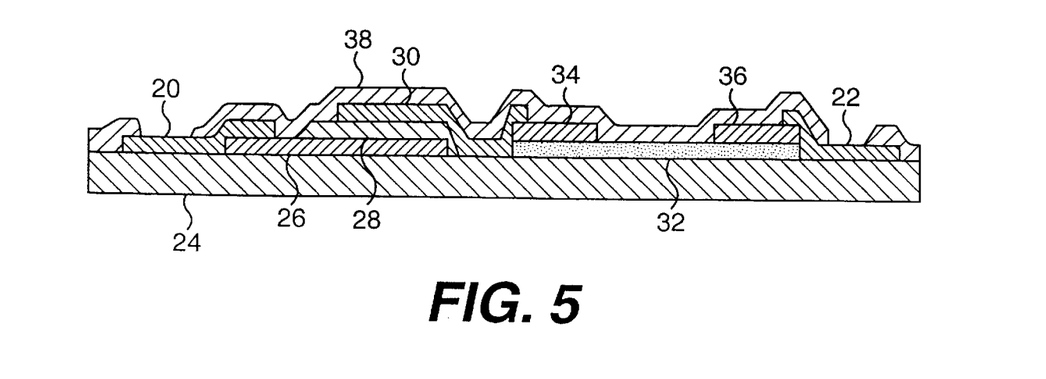
FIG. 5 is a cross-sectional view as taken along line 5—5 of FIG. 3.

In the illustrated embodiment, RC circuits 18 are constructed according to thin film processing techniques. A number of layers are sequentially built up (as will be explained more fully below) to yield the desired circuit arrangement. As can be seen in FIG. 5, the various layers are deposited on a substrate 24, which will often be an insulating substrate such as oxidized silicon, glass or $Al_2O_3$. In many embodiments, the thickness of substrate 24 may be about 0.3 to 1.2 mm.

The various layers in each of RC circuits 18 will now be explained. A conductive layer 26 is located on the top surface of substrate 24. Conductive layer 26 is suitably patterned to form a first capacitor plate and to provide an interconnect to terminal pad 20. A layer 28 of a selected dielectric material is located above the capacitor plate formed by conductive layer 26. The dielectric layer is thus juxtaposed and intimate with the underlying capacitor plate. A portion of another conductive layer 30 extends over dielectric layer 26. This will provide a second capacitor plate opposed to the first capacitor plate so as to produce a capacitor.

Often, the thin film capacitors employed in each of RC circuits 18 will utilize a high-K dielectric to achieve a relatively large capacitance value while requiring a very small plate area. For example, it will often be desirable to utilize a dielectric material exhibiting a dielectric constant of approximately 100 or more. A dielectric constant of greater than approximately 500 will often be preferred, while a dielectric constant as high as 10,000 may be used in some exemplary embodiments.

Certain lead-based dielectrics, such as $Pb(Zr,Ti)O_3$ (referred to as PZT), may be employed in preferred embodiments of the invention. Often, the PZT may be doped with Nb or other suitable dopant, thereby yielding a PNZT material. Various aspects of PZT dielectrics are discussed in U.S. Pat. No. 5,625,529 to Lee, incorporated herein by reference. Another material of use is lead magnesium niobate-lead titanate, $Pb(Mg_{1/3}Nb_{2/3})O_3$—$PbTiO_3$.

In addition, various non-lead materials may also be used as the dielectric in certain embodiments. Examples of such materials include strontium barium titanate $(Sr,Ba)TiO_3$ and bismuth strontium tantalate, $Bi_2SrTa_2O_9$.

As also shown in FIG. 5, the remainder of conductive layer 30 provides an electrical interconnect to a thin film resistor also located on substrate 24. In this embodiment, the resistor is formed by a resistive layer 32 having conductive layer portions 34 and 36 thereon. As will be explained more fully below, portions 34 and 36 begin as a continuous layer over resistive layer 32. A selected area of the continuous conductive layer is then removed to expose the resistor material underneath. The amount of the continuous layer that is removed will determine the resistance value of the resulting resistor. Conductive layer portion 36 is electrically connected to terminal pad 22, as shown, to complete the series RC arrangement.

The various layers are covered with an a suitable overcoat or encapsulate 38. Encapsulate 38 protects the underlying circuits from scratching and corrosion, and also provides electrical stability. As shown, encapsulate 38 is suitably patterned to expose the terminal pads. In exemplary embodiments, a suitable material for encapsulate 38 may be selected from thin films of inorganic materials such as silicon nitride ($Si_8N_4$), silicon oxide ($SiO_2$), silicon oxynitride (SiON), and various nonstoichiometric combinations designated as $Si_vH_wC_xO_yN_z$. Alternatively, the encapsulate may be made from various films of organic polymers including polyimides, epoxies, or benzocyclobutene (BCB), as well as combinations of layers of inorganic and organic materials.

While eight RC circuits are provided in the exemplary embodiment shown in the drawings, it should be appreciated that more or fewer numbers of circuits may be provided in accordance with the present invention. For example, as few as four or as many as 100 separate RC combinations may be easily provided according to the teachings herein. Generally, the value of each such resistor will fall in a range of about 5 ohms to about 500 kilohms. The capacitors will often have values falling in a range of about 4 picofarads to about 100,000 picofarads.

Despite the fact that device 10 has multiple circuits in a single package, the exterior dimensions of device 10 will often be quite small. For example, it would not be unusual for the length and width of the device to fall within a range of about 0.3 mm to 5.0 mm on edge. It will be appreciated that the length and width of device 10 will generally be defined by the number and value of the electrical components, or the number of terminals and the pitch between the respective terminals. For example, it is contemplated that the pitch between adjacent terminations may be at least 100 $\mu$m in many embodiments of the invention.

Figure 6A:
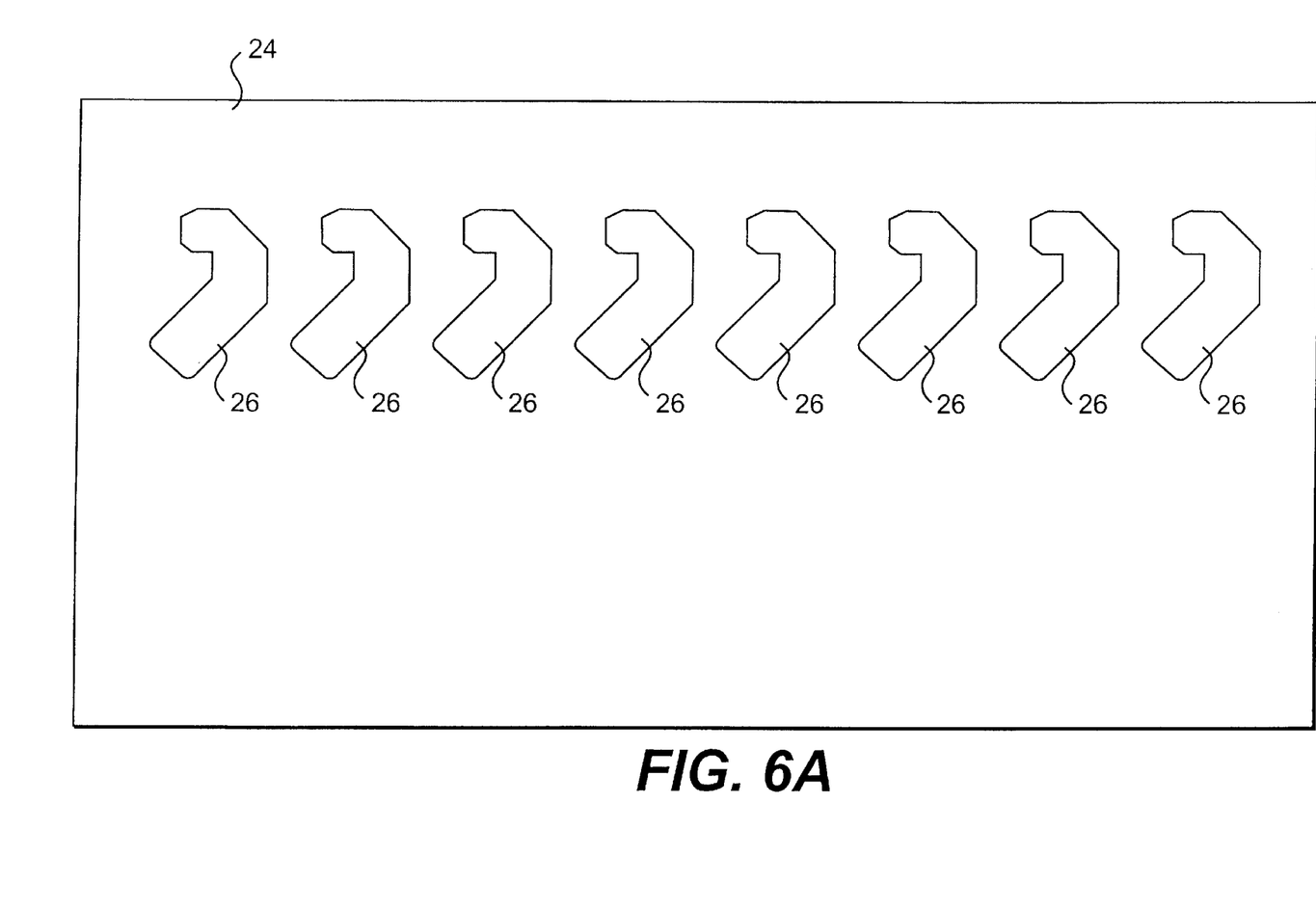
FIGS. 6A through 6E illustrate successive steps in the manufacture of an array device as in FIG. 1.

FIGS. 6A through 6E illustrate various steps employed in the manufacture of device 10. Referring first to FIG. 6A, a respective conductive layer 26 is defined on substrate 24 for each of the RC circuits to be made. Before metal is applied, substrate 24 is preferably polished and cleaned to provide a smooth surface suitable for further processing. A layer of platinum or other suitable metal, along with any necessary adhesion layer, is then applied by any one of various thin film deposition techniques, such as sputtering or evaporation. The metal is patterned, such as by standard photolithographic techniques, to form the pattern of conductive layers 26.

Figure 6B:
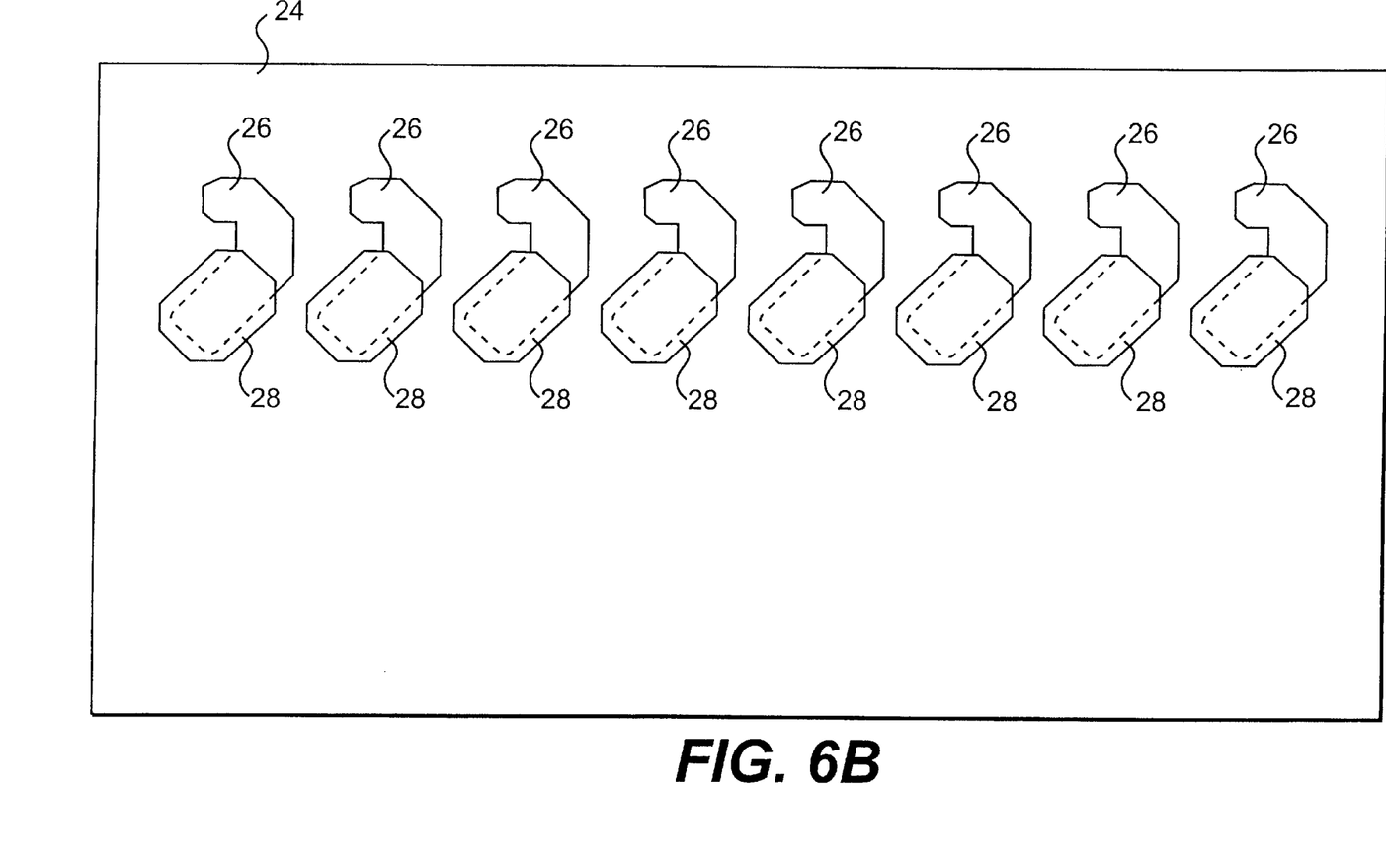

FIG. 6B illustrates a respective dielectric layer 28 applied to cover a selected portion of each of the conductive layers 26. As described above, dielectric layer 28 may be a lead-based dielectric having a relatively high dielectric constant. According to preferred methodology, the dielectric is applied by a sol-gel spin coating process. The viscous nature of the material and the spin speed regulate the thickness of the coated film. The film is subsequently patterned and calcined as desired.

A sol-gel process that applies relatively thick coating cycles is particularly preferred to achieve a given layer thickness with a fewer coats. For example, a 1,3-propanediol-based PZT solution synthesis may be utilized to apply PZT films having a thickness of 0.2–0.8 $\mu$m per spin casting cycle. As such, only two coats may be necessary to achieve desired thickness levels of about 0.4–1.6 $\mu$m. This is in comparison with many conventional sol-gel techniques which may only achieve a thickness of about 0.1 $\mu$m with each coating cycle. A more detailed description of sol-gel coating processes that may be utilized herein is given in Liu et al., "Thick Layer Deposition of Lead Perovskites Using Diol-Based Chemical Solution Approach," *Integrated Ferroelectrics*, 1997, Vol. 18, pp. 263–274. Certain aspects of such sol-gel processing are also described in commonly-assigned application Ser. No. 09/034,754, incorporated herein by reference.

Figure 6C:
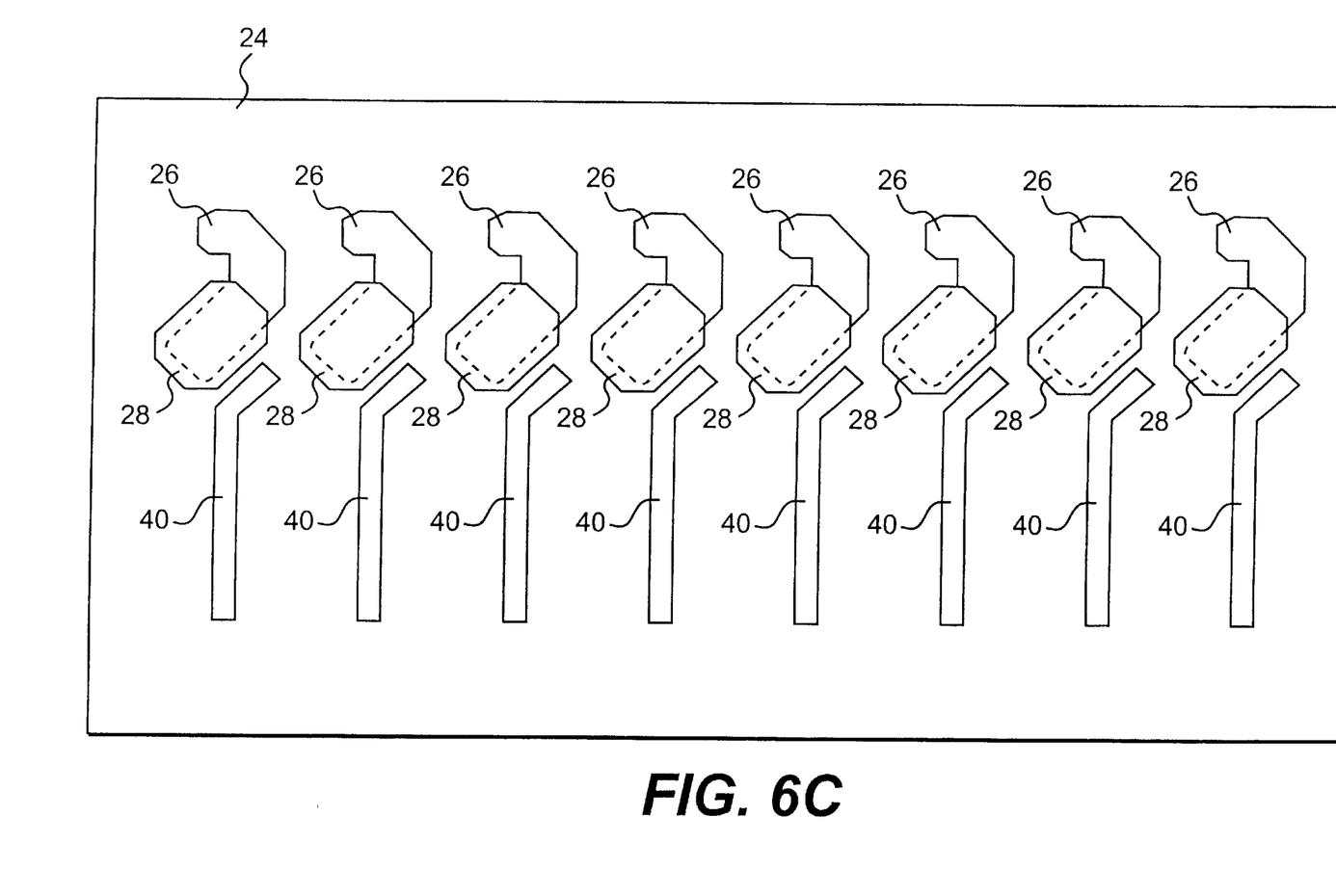

Referring now to FIG. 6C, a pattern 40 comprising a combination of two contiguous materials is formed for each of the RC circuits to be made. Toward this end, a first film of resistive material is applied, which may be formed from any of the known resistive materials (e.g., tantalum nitride, nickel chromium, TaAl, TaAlN, SiCr, CrSiO, or cermets). A second film of a suitable conductive material is then overlaid over the resistive material. Any of the known suitable conductors may be used for this purpose, including gold, palladium, copper, aluminum and their respective adhesion layers. Patterns 40 are then produced by photolithography or other suitable patterning technique.

Figure 6D:
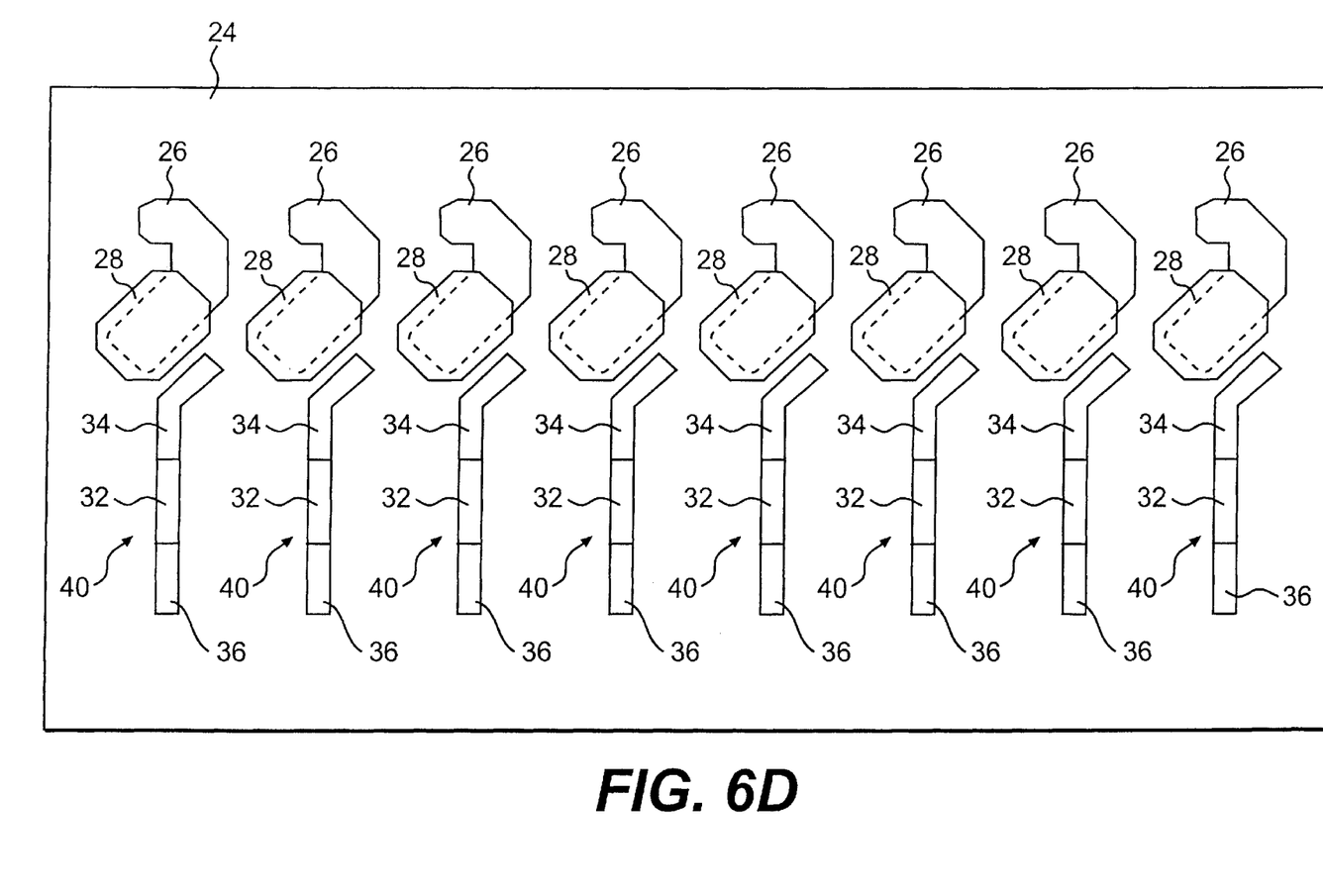

Next, as shown in FIG. 6D, the conductive material is removed from the area of pattern 40 where the resistor is to be formed. Because only resistive material is left in this region, the resistor will not be shorted as it is in other portions of the composite structure. The resistance value can be very accurately controlled by the amount of conductive material removed.

Figure 6E:
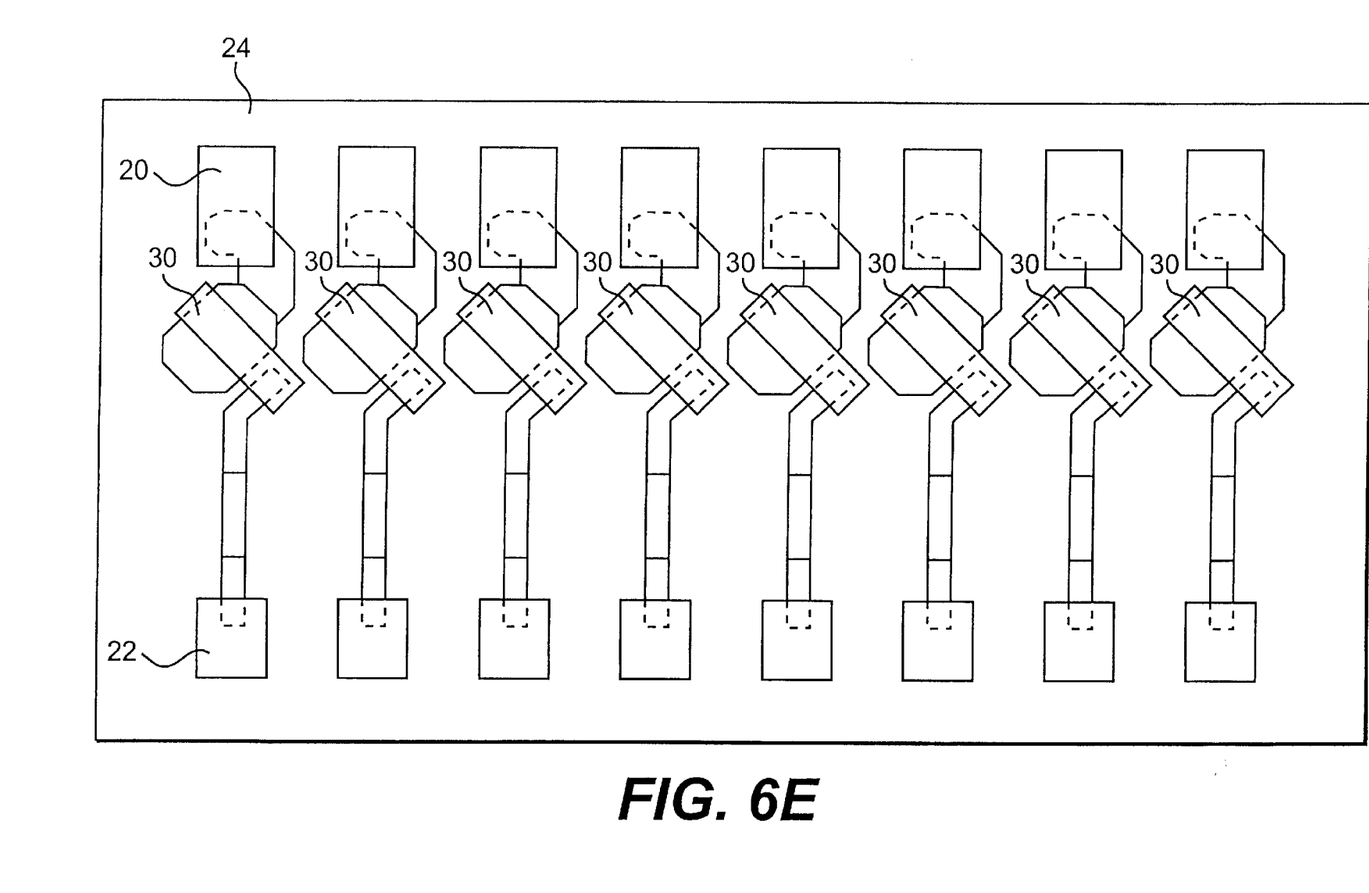

Referring now to FIG. 6E, additional patterned conductors may then be formed in a manner similar to other conductive layers to complete the RC circuits. For example, a respective conductive layer 30 forms the top plate of each capacitor, as well as providing an interconnect to the respective thin film resistor. Terminal pads 20 and 22 may also be formed at this time. The various layers formed on substrate 24 are then encapsulated as described above. The encapsulate material is patterned, such as by photolithography, to expose the terminal pads.

Figure 7:
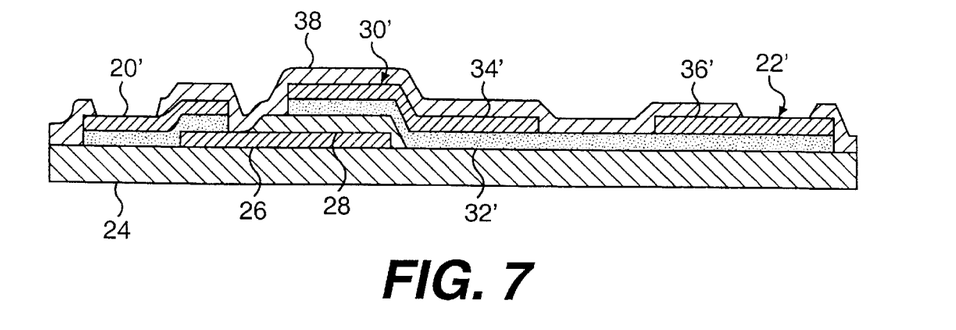
FIG. 7 is a cross-sectional view similar to FIG. 5 of an alternative construction of an RC array device constructed in accordance with the present invention.

FIG. 7 illustrates an alternative embodiment that may simplify the manufacturing process in comparison with the embodiment discussed above. Conductive layer 26 and dielectric layer 28 are formed on the surface of substrate 24 as described above. As can be seen, however, all of the remaining circuitry needed to complete each of the RC circuits can be simultaneously produced.

Specifically, the remaining circuitry is produced of a composite resistor/conductor structure like that used to produce only the resistor in the previous embodiment. Thus, terminal pad 220', terminal pad 22' and conductive layer 30' each comprises a conductive layer located above a layer of resistive material. The resistive layer is shorted by the overlayed conductor, and does not significantly affect circuit operation at such locations. In fact, the resistive layer advantageously takes the place of and functions as an adhesive layer that may have otherwise been required under the conductive material. Where a resistor may be desired, the overlayed conductive layer is removed as described above leaving conductive layer portions 34' and 36'.

The resistive layer 32' does not degrade the performance of the device in making a vertical electrical connection between layers. In all embodiments, the thickness of the layer 32' is much less than the area of contact. Since the contact resistance is proportional to the thickness of layer 32' divided by the contact area, that contact resistance will be negligibly small.

In the illustrated embodiment, the resistor is formed at a location away from the second capacitor plate (formed by portion 30' of the conductive layer/resistive layer combination). It is also contemplated, however, that the resistor may be formed by removal of the conductive layer at the second capacitor plate. In such embodiments, the resistive layer at this location will serve as both the resistor and second capacitor plate. It is believed that distributed RC characteristics produced by such an arrangement may be advantageous in many potential applications of the present invention.

Figure 8:
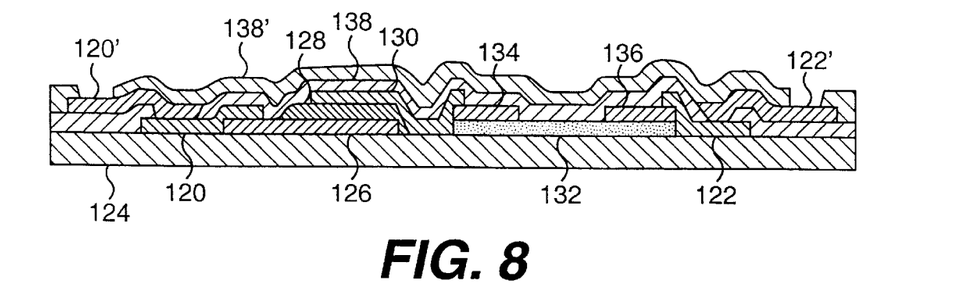
FIG. 8 is a view similar to FIG. 7 of a further embodiment having an outer compliant layer.

FIG. 8 illustrates an alternative embodiment similar in many respects to the embodiment shown in FIG. 5. For the sake of brevity, elements similar or analogous to those in the FIG. 5 embodiment are indicated by a reference number augmented by 100. In this case, however, a compliant layer is provided to absorb stress between the device and the circuit board to which it is mounted.

Specifically, encapsulate layer 138 functions as a compliant layer for sheer strains induced by lateral forces on the terminal pads due to differences in thermal expansion of the device substrate and the circuit board. An additional layer of metalization is provided on top of encapsulate layer 138 to form auxiliary terminal pads 120' and 122'. The additional metal layer thus redistributes the terminal pads from the prior position to a location on encapsulate layer 138. A further encapsulate layer 138' is then provided over the remainder of the structure. Openings are defined in the encapsulate layer 138' so that terminal pads 120' and 122' will be exposed.

Figure 9:
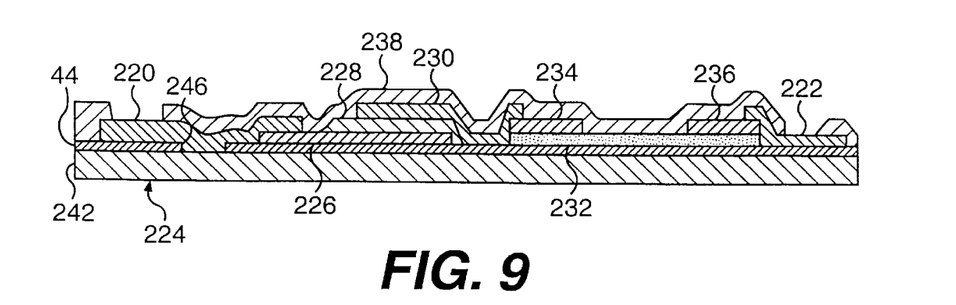
FIG. 9 is a view similar to FIG. 7 of a still further embodiment having a grounded substrate.

FIG. 9 illustrates a still further embodiment, also similar to the embodiment of FIG. 5, in which similar or analogous elements will be indicated by a reference number augmented by 200. In this case, insulating substrate 224 is made from a first layer 242 of silicon which is oxidized on its surface, as indicated at 244, to provide an insulating layer. The layer forming terminal pad 220, which is electrically connected to first capacitor plate 226, is grounded to silicon layer 242 through a via 246 in the oxidation layer. This arrangement will beneficially provide some parasitic capacitance.

Figure 10:
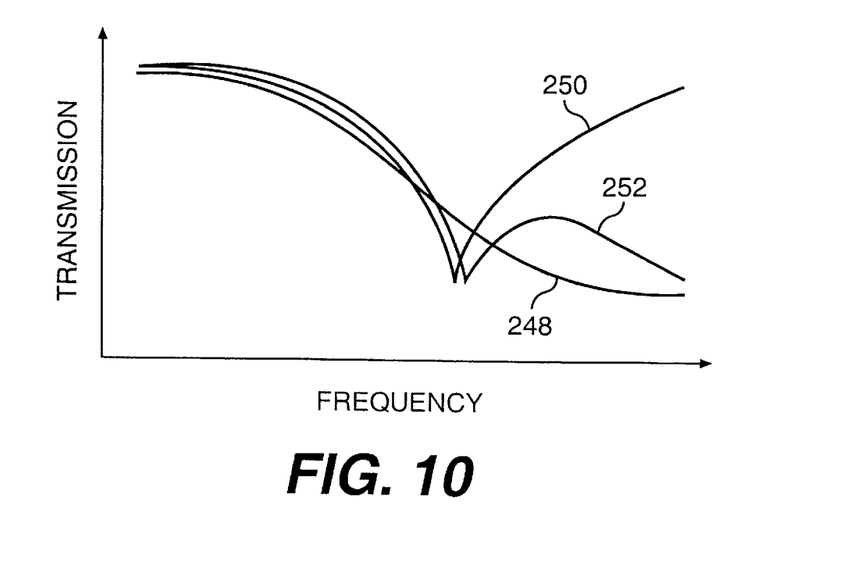
FIG. 10 is graph illustrating frequency response of a T-filter circuit in accordance with the invention in comparison with a theoretical ideal.

The benefits of the grounding arrangement as illustrated in FIG. 9 can be most easily explained with reference to FIG. 10. Curve 248 shows a theoretical ideal for frequency response of a "T-filter" such as that illustrated in FIG. 4A. Curves 250 and 252 illustrate the performance of real circuits made without and with substrate grounding, respectively.

In the ideal case, as shown by curve 248, the signal is increasingly blocked up to a limit as frequency increases. In the case of a real circuit without grounding, as shown in curve 250, transmission increases once past a minimum due to inductance. Thus, the importance of grounding can be easily seen with reference to curve 252. When beneficial parasitic capacitances are added, the signal is maintained within a tolerance of the ideal case.

It can be seen that the present invention provides integrated arrays desirably having a high concentration of circuit elements in a very small size package. One skilled in the art will appreciate that variations and modifications may be made without departing from the invention.

For example, each of the embodiments shown in the drawings utilizes a capacitor arrangement where capacitor plates are opposed, one on top of the other. It should be appreciated, however, that various other types of capacitor structures are included within the teachings of the present invention. In this regard, it may be desirable in some applications to form capacitors as "gap caps" in which coplanar capacitor electrodes are located on the surface of a dielectric and separated by a predetermined gap.

In addition, the above embodiments illustrate substrates which are insulating, or are made insulating before the circuit elements are built up. In some embodiments, such as those configured to have a common ground, it may be desirable to use a conductive substrate. Where a conductive substrate is used it will generally be necessary to isolate some of the circuit elements, such as the resistors, with discrete insulation.

One skilled in the art will also appreciate that aspects of the various embodiments may be interchanged both in whole or in part. Furthermore, those of ordinary skill in the art will appreciate that the foregoing description is by way of example only, and is not intended to be limitative of the invention so further described in such appended claims.

What is claimed is:

1. A miniature array device for inverted mounting to a surface, said device comprising:
   a substrate having predetermined width and length dimensions;
   a plurality of thin film RC circuits located on said substrate, each of said RC circuits including at least one terminal pad for connection thereof to external circuitry located on said surface and wherein each of said RC circuits comprise at least one capacitor and at least one thin film resistor and wherein dielectric material forming a dielectric layer between respective plates of said at least one capacitor has a dielectric constant of at least 100;
   an encapsulate disposed over said RC circuits, said encapsulate defining at least one opening therein to expose the at least one terminal pad thereof; and
   solder material being located in said openings defined in said encapsulate.

2. A miniature array device as set forth in claim 1, wherein said encapsulate comprises an inner compliant layer and an outer encapsulate layer, said at least one opening being defined in said outer encapsulate layer.

3. A miniature array device as set forth in claim 1, wherein said plurality of RC circuits comprises at least four RC circuits.

4. A miniature array device as set forth in claim 3, wherein said at least one resistor has a value in a range of about 5 ohms to about 500 kilo-ohms and said at least one capacitor has a value of about 4 picofarads to about 100,000 picofarads.

5. A miniature array device as set forth in claim 4, wherein said dielectric material comprises a lead-based dielectric material.

6. A miniature array device as set forth in claim 5, wherein said lead-based dielectric material comprises a PZT dielectric material.

7. A miniature array device as set forth in claim 4, wherein said dielectric layer has a thickness of only about 0.1 to 2 $\mu$m.

8. A miniature array device as set forth in claim 4, wherein said at least one resistor and said at least one capacitor of at least some of said RC circuits is connected to provide a respective series RC circuit.

9. A miniature array device as set forth in claim 1, wherein each of said RC circuits comprises a plurality of layers patterned to form predetermined circuit elements.

10. A miniature array device as set forth in claim 9, wherein said plurality of layers comprise:
    a first conductive pattern defining at least one first capacitor plate;
    the dielectric layer juxtaposed to said at least one first capacitor plate;
    a second conductive pattern defining at least one second capacitor plate, said at least one second capacitor plate being situated in relation to said at least one first capacitor plate so as to form said at least one capacitor; and
    a said at least one thin film resistor electrically connected to said at least one second capacitor plate.

11. A miniature array device as set forth in claim 10, wherein said thin film resistor is formed from said at least one patterned combination having a conductive layer contiguous to a resistor layer, a portion of said conductive layer being removed from said resistor layer to provide a predetermined resistor value.

12. A miniature array device as set forth in claim 11, further comprising a terminal conductive layer defining said at least one terminal pad.

13. A miniature array device as set forth in claim 9, wherein said plurality of layers comprise:
    a first conductive pattern defining at least one first capacitor plate;
    the dielectric layer juxtaposed to said at least one first capacitor plate;
    a patterned combination including a conductive layer contiguous to a resistor layer, part of said patterned combination forming said at least one second capacitor plate being situated in relation to said at least one first capacitor plate so as to form said at least one capacitor; and
    said conductive layer being removed from said resistor layer in a portion of said patterned combination to provide a predetermined resistor value.

14. A miniature array device as set forth in claim 13, wherein said patterned combination further defines one of said at least one terminal pads.

15. A miniature array device for inverted mounting to a surface, said device comprising:
    a substrate having predetermined width and length dimensions;
    a plurality of thin film RC circuits located on said substrate, each of said RC circuits including:
    (a) a first conductive pattern disposed on said substrate, said first conductive pattern defining at least one first capacitor plate;
    (b) a dielectric layer disposed on said at least one first capacitor plate having a dielectric constant of at least 100;
    (c) a second conductive pattern defining at least one second capacitor plate, said at least one second capacitor plate being situated in relation to said at least one first capacitor plate so as to form a capacitor;
    (d) a thin film resistor electrically connected to said at least one second capacitor plate; and
    (e) terminal conductors defining terminal pads of said RC circuits.

16. A miniature array device as set forth in claim 15, wherein said thin film resistor is formed from a patterned combination having a conductive layer contiguous to a resistor layer, a portion of said conductive layer being removed from said resistor layer to provide a predetermined resistor value.

17. A miniature array device as set forth in claim 16, further comprising an encapsulate disposed over said RC circuits, said encapsulate defined to expose said terminal pads.

18. A miniature array device for inverted mounting to a surface, said device comprising:

a silicon substrate having predetermined width and length dimensions;

a plurality of thin film RC circuits located on said substrate, each of said RC circuits including:
  (a) a first conductive pattern disposed on said substrate, said first conductive pattern defining at least one first capacitor plate;
  (b) a dielectric layer juxtaposed to said at least one first capacitor plate and having a dielectric constant of at least 100;
  (c) a patterned combination having a conductive layer contiguous to a resistor layer, part of said patterned combination defining at least one second capacitor plate situated in relation to said at least one first capacitor plate so as to form a capacitor;
  (d) said conductive layer being removed from said resistor layer in a portion of said combination to provide a predetermined resistor value; and
  (e) wherein said patterned combination further defines terminal pads of said RC circuits.

19. A miniature array device as set forth in claim 18, further comprising an encapsulate disposed over said RC circuits, said encapsulate defined to expose said terminal pads.

20. A miniature array device as set forth in claim 18, wherein said substrate further includes an oxidized upper layer.

21. A miniature array device as set forth in claim 20, comprising a via in the oxidized upper layer of said silicon substrate, said first conductive pattern extending into said via for electrical connection to said silicon substrate underlying said oxidized upper layer.

22. A method of manufacturing a thin film array device comprising a plurality of RC circuits, said method comprising the steps of:
  (a) providing a generally planar substrate having predetermined length and width dimensions;
  (b) applying a first conductive layer to said substrate, said first conductive layer formed so as to define a plurality of first capacitor plates;
  (c) applying a dielectric layer having a dielectric constant of at least 100 to cover said first capacitor plates of said first conductive layer;
  (d) applying a second conductive layer defining a plurality of second capacitor plates opposed to respective of said first capacitor plates to produce respective capacitor devices and further defining terminal pads of said RC circuits;
  (e) forming a plurality of thin film resistors, at least one of said resistors being associated with each of said capacitor devices and being electrically connected thereto; and
  (f) applying an encapsulate over said layers on said substrate.

23. A method as set forth in claim 22, wherein said thin film resistors are formed by removing selected portions of a conductive layer contiguous to a resistor layer.

* * * * *

UNITED STATES PATENT AND TRADEMARK OFFICE
CERTIFICATE OF CORRECTION

PATENT NO. : 6,285,542 B1 Page 1 of 1
DATED : September 4, 2001
INVENTOR(S) : Robert M. Kennedy, III, Gheorghe Korony, Donghang Liu, Jeffrey P. Mevissen and Robert H. Heistand, II It is certified that error appears in the above-identified patent and that said Letters Patent is hereby corrected as shown below:

<u>Column 9,</u>
Line 32, insert -- at least one -- after "said"; and delete "openings" and insert -- opening --.
Line 57, delete "is" and insert -- are --.

<u>Column 10,</u>
Line 6, delete "a" before "said at least one".
Line 9, insert -- at least one -- before "thin film resistor"; delete "said at least";
Line 10, delete "one" and insert -- a --.
Line 34, delete "pads" and insert -- pad --.

Signed and Sealed this

Twenty-seventh Day of August, 2002

*Attest:*

JAMES E. ROGAN
*Attesting Officer*     Director of the United States Patent and Trademark Office